(12) United States Patent  
Seo et al.

(10) Patent No.: US 8,350,287 B2
(45) Date of Patent: Jan. 8, 2013

(54) LIGHT EMITTING ELEMENT

(75) Inventors: Tae Won Seo, Ansan (KR); Zhbanov Alexander, Ansan (KR); Dae Won Kim, Ansan (KR)

(73) Assignee: Seoul Semiconductor Co., Ltd., Seoul (KR)

( * ) Notice: Subject to any disclaimer, the term of this patent is extended or adjusted under 35 U.S.C. 154(b) by 0 days.

(21) Appl. No.: 13/187,090

(22) Filed: Jul. 20, 2011

(65) Prior Publication Data

US 2011/0278636 A1 Nov. 17, 2011

Related U.S. Application Data

(60) Continuation-in-part of application No. 13/027,107, filed on Feb. 14, 2011, which is a division of application No. 12/094,206, filed as application No. PCT/KR2006/004898 on Nov. 21, 2006, now Pat. No. 7,948,002.

(30) Foreign Application Priority Data

Nov. 21, 2005 (KR) .................. 10-2005-0111255
Nov. 23, 2005 (KR) .................. 10-2005-0112440

(51) Int. Cl.
    *H01L 33/00* (2010.01)
(52) U.S. Cl. ............. 257/99; 257/675; 257/E33.065; 257/E33.066; 257/E33.075
(58) Field of Classification Search .............. 257/99, 257/675, E33.065, E33.066, E33.075
See application file for complete search history.

(56) References Cited

U.S. PATENT DOCUMENTS

| 5,557,115 A | 9/1996 | Shakuda |
| 6,084,252 A | 7/2000 | Isokawa et al. |
| 6,483,623 B1 | 11/2002 | Maruyama |
| 6,494,597 B1 | 12/2002 | Yu |
| 2003/0008431 A1* | 1/2003 | Matsubara et al. ......... 438/98 |

(Continued)

FOREIGN PATENT DOCUMENTS

| JP | 3-109781 | 5/1991 |
| JP | 4-206764 | 7/1992 |
| JP | 6-104490 | 4/1994 |
| JP | 10-190069 | 7/1998 |
| KR | 10-2003-0081100 | 10/2003 |
| KR | 10-2005-0090918 | 9/2005 |

OTHER PUBLICATIONS

International Search Report of PCT/KR2006/004898 issued on Feb. 16, 2007, corresponding to U.S. Appl. No. 12/094,206.

(Continued)

*Primary Examiner* — Tu-Tu Ho
(74) *Attorney, Agent, or Firm* — H.C. Park & Associates, PLC

(57) ABSTRACT

A heat radiation structure of a light emitting element has leads, each lead having a plurality of leg sections, and a light emitting chip mounted on any one of the leads. The present invention can provide a high-efficiency light emitting element, in which a thermal load is reduced by widening a connecting section through which a lead and a chip seating section of the light emitting element are connected, and the heat generated from a heat source can be more rapidly radiated to the outside. Further, the present invention can also provide a high-efficiency light emitting element, in which heat radiation fins are formed between a stopper and a molding portion of a lead of the light emitting element so that natural convection can occur between the heat radiation fins, and an area in which heat radiation can occur is widened to maximize a heat radiation effect.

22 Claims, 11 Drawing Sheets

U.S. PATENT DOCUMENTS

| | | | |
|---|---|---|---|
| 2003/0151343 | A1 | 8/2003 | Jeganathan et al. |
| 2003/0168670 | A1 | 9/2003 | Roberts et al. |
| 2005/0089070 | A1 | 4/2005 | Honda |
| 2005/0151231 | A1 | 7/2005 | Yoshida |
| 2005/0168922 | A1 | 8/2005 | Tay et al. |
| 2005/0173723 | A1 | 8/2005 | Weng et al. |
| 2005/0194600 | A1 | 9/2005 | Takekuma |
| 2005/0263784 | A1 | 12/2005 | Yaw et al. |
| 2006/0119250 | A1 | 6/2006 | Suehiro et al. |
| 2006/0186429 | A1 | 8/2006 | Chew |
| 2010/0157583 | A1* | 6/2010 | Nakajima .................... 362/184 |

OTHER PUBLICATIONS

Non-Final Office Action of U.S. Appl. No. 12/094,206 issued on May 7, 2010.

Final Office Action of U.S. Appl. No. 12/094,206 issued on Oct. 15, 2010.

Notice of Allowance of U.S. Appl. No. 12/094,206 issued on Jan. 25, 2011.

First Office Action of German Patent Application No. 11 2006 003 211.9.33 issued on Nov. 26, 2010, corresponding to U.S. Appl. No. 12/094,206.

Final Office Action of U.S. Appl. No. 13/027,107 mailed on Nov. 16, 2011.

Non-Final Office Action for U.S. Appl. No. 13/027,107 issued on Aug. 1, 2011.

Non-Final Office Action of U.S. Appl. No. 13/027,107 dated Mar. 8, 2012.

Final Office Action issued for related U.S. Appl. No. 13/027,107 dated Jun. 15, 2012.

Notice of Allowance issued for related U.S. Appl. No. 13/027,107 dated Sep. 14, 2012.

* cited by examiner

LIGHT EMITTING ELEMENT

CROSS REFERENCE RELATED APPLICATIONS

This application is a continuation-in-part of U.S. patent application Ser. No. 13/027,107, filed on Feb. 14, 2011, which is a divisional of U.S. patent application Ser. No. 12/094,206, filed on May 19, 2008, which is the national stage of International Application No. PCT/KR2006/004898, filed Nov. 21, 2006, and claims priority from and the benefit of Korean Patent Application No. 10-2005-0111255, filed on Nov. 21, 2005, and Korean Patent Application No. 10-2005-0112440, filed on Nov. 23, 2005, which are all hereby incorporated by reference for all purposes as if fully set forth herein.

BACKGROUND OF THE INVENTION

1. Field of the Invention

The present invention relates to a light emitting element, and more particularly, to a heat radiation structure of a light emitting element, which has leads, each lead having a plurality of leg sections, and a light emitting chip mounted on any one of the leads.

2. Discussion of the Background

FIG. 1 is a perspective view of a light emitting element according to a prior art.

As shown in FIG. 1, a conventional light emitting element includes first and second leads 10 and 20; a light emitting chip 30 mounted on the first lead 10; a wire 40 connecting the light emitting chip 30 and the second lead 20; and a molding portion 50 encapsulating portions of the first and second leads 10 and 20 and the light emitting chip 30. At this time, each of the first and second leads 10 and 20 has two leg sections, which are connected to each other through a connecting section 10a at top portions of the leg sections. Particularly, the first lead 10 further includes a chip seating section 10b formed to extend from the connecting section toward a connecting section of the second lead 20, and the light emitting chip 30 is mounted on the chip seating section 10b.

In the aforementioned structure of the light emitting element according to the prior art, electric energy moves from the connecting section, as an electrical connecting section, to the chip seating section. Further, heat generated from the light emitting chip 20 also moves through the same path. However, since an existing lead is designed such that the connecting section 10a is narrower than the chip seating section 10b in order to reduce a material as shown in FIG. 1, a thermal load is concentrated therebetween, which results in a problem such as exfoliation. Moreover, since the area of a path through which heat flows is small, a relatively large amount of heat is not radiated. Therefore, there is a problem in a heat radiation effect.

Further, since the conventional light emitting element having the aforementioned configuration includes the leads, which protrude to the outside of the molding portion 50 only to receive external input without any additional structure, a surface area for heat radiation is limited. Accordingly, since convection naturally occurring due to a temperature difference is limited and thus heat radiation through the convection does not occur, so there is a problem in that the temperature of the entire light emitting element rises, and it is difficult to provide a high-efficiency light emitting element since the heat in the interior of the light emitting element is not rapidly radiated to the outside and thus a temperature difference between the interior and exterior of the light emitting element is large.

SUMMARY OF THE INVENTION

Accordingly, the present invention is conceived to solve the aforementioned problems in the prior art. An object of the present invention is to provide a high-efficiency light emitting element by improving a heat radiation structure thereof.

In order to achieve the object, the present invention provides a light emitting element with a lead installed thereto, the lead including a plurality of leg sections branched to be space apart from each other, a connecting section for connecting the leg sections, and a chip seating section connected to the connecting section, wherein the minimum width of the connecting section is identical with or larger than the width of the chip seating section.

At least one of the leg sections may comprise a heat radiation fin extending toward another of the leg sections. Preferably, a stopper is formed to protrude on a central portion of the leg section, and the heat radiation fin is formed above the stopper. The leg section may comprise a lower leg portion and an upper leg portion having a width larger than the lower leg portion. The entire shape of the chip seating section and the connecting section may be a rectangle. However, the shape is not limited thereto. The chip seating section and the connecting section may be shaped so that the width of the entire shape thereof becomes narrow from the connecting section to a distal end of the chip seating section.

Further, the present invention provides a light emitting element with a lead installed thereto, the lead including a plurality of leg sections branched to be spaced apart from each other, wherein at least one of the leg sections comprises a heat radiation fin extending toward another of the leg sections.

Preferably, a stopper is formed to protrude on a central portion of the leg section, and the heat radiation fin is formed above the stopper. Further, it is preferred that the two leg sections be formed in parallel with each other. At this time, an upper portion of the leg section may be wider than a lower portion thereof.

In addition, the present invention provides a light emitting element with a lead installed thereto, the lead including leg sections branched to be spaced apart from each other, wherein at least one of the leg sections comprises a heat radiation fin extending opposite to another of the leg sections.

At this time, the light emitting element may further comprise a dummy lead branched to extend from an end of the heat radiation fin.

Further, preferably, the light emitting element comprises a molding portion encapsulating an end of the lead, and at least a portion of an end of the branched dummy lead is encapsulated by the molding portion.

As described above, the present invention can provide a high-efficiency light emitting element, in which a thermal load is reduced by widening a connecting section through which a lead and a chip seating section of the light emitting element are connected, and the heat generated from a heat source can be more rapidly radiated to the outside.

Further, the present invention can also provide a high-efficiency light emitting element, in which heat radiation fins are formed between a stopper and a molding portion of a lead of the light emitting element so that natural convection can occur between the heat radiation fins, and an area in which heat radiation can occur is widened to maximize a heat radiation effect.

DETAILED DESCRIPTION OF THE ILLUSTRATED EMBODIMENTS

Figure 1:
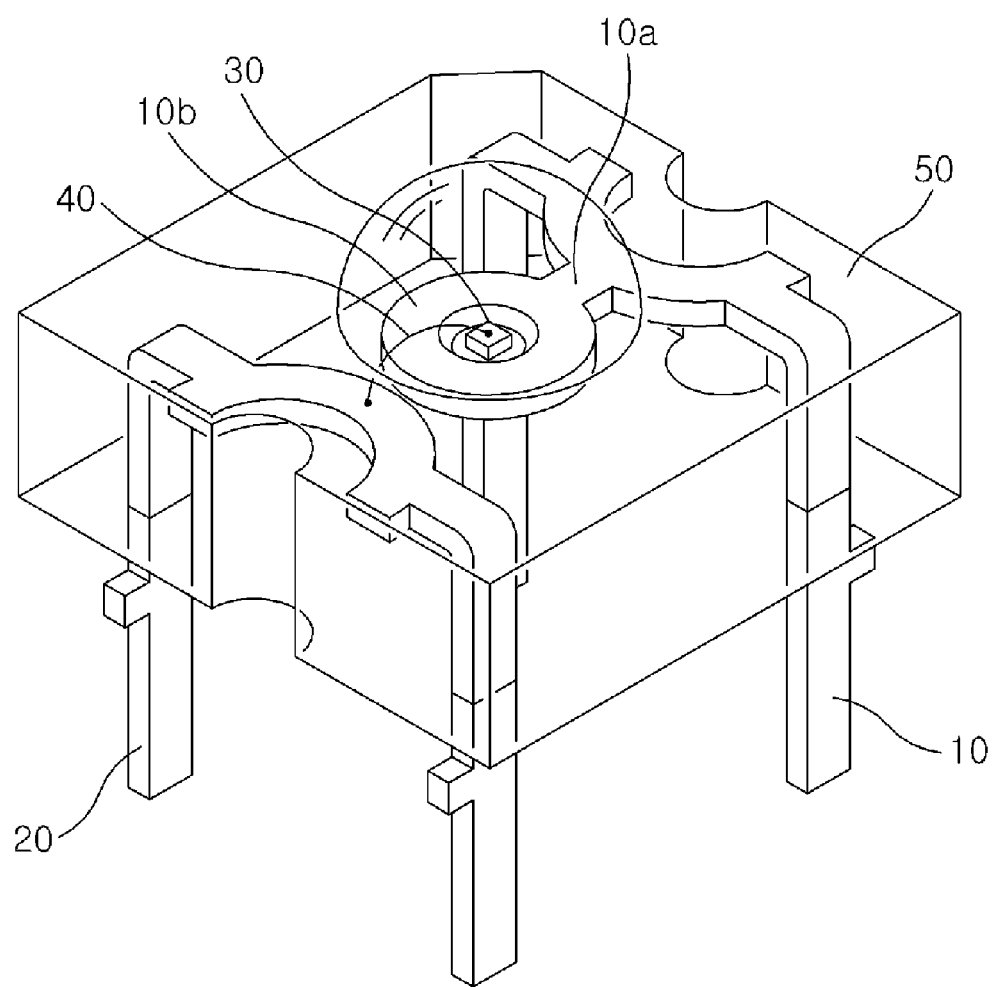
FIG. 1 is a perspective view of a light emitting element according to a prior art.

Hereinafter, preferred embodiments of the present invention will be described in detail with reference to the accompanying drawings.

However, the present invention is not limited to the embodiments but may be embodied into different forms. These embodiments are provided only for illustrative purposes and for full understanding of the scope of the present invention by those skilled in the art. Throughout the drawings, like elements are designated by like reference numerals.

Figure 2:
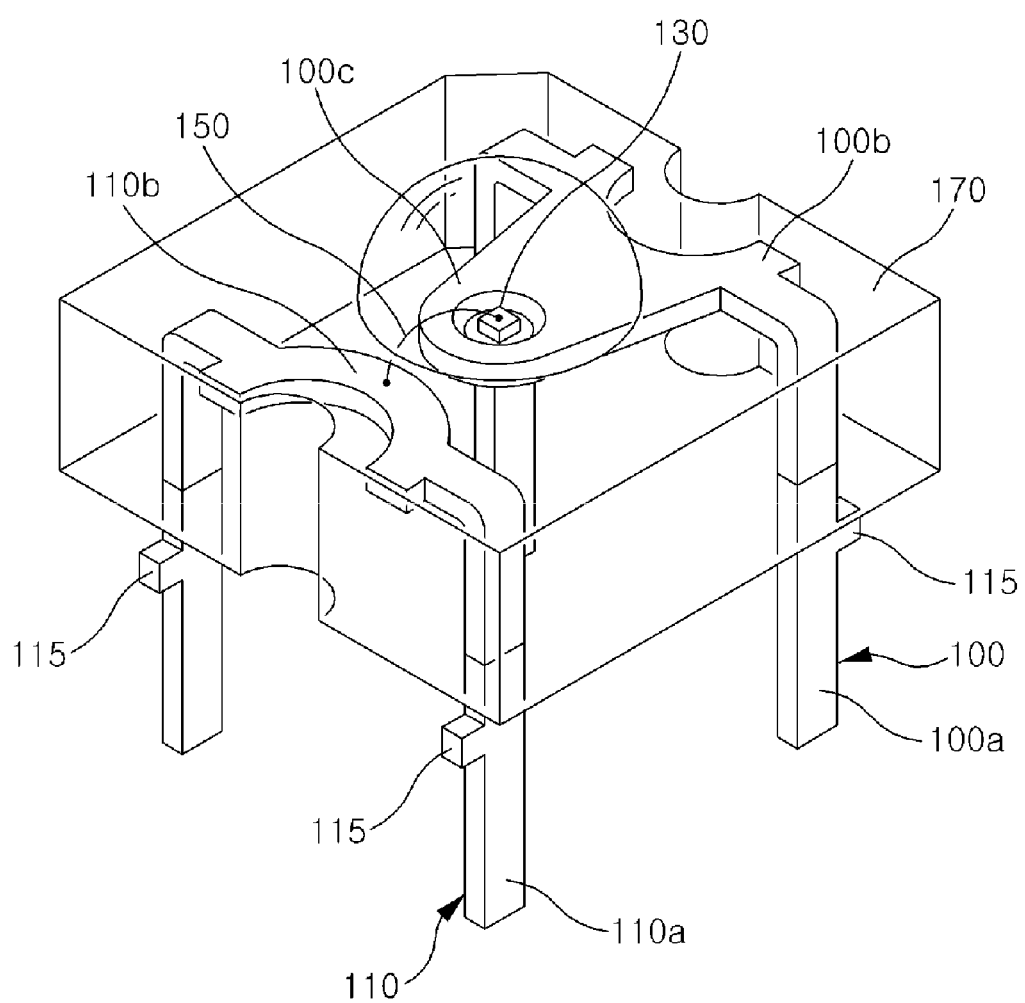
FIG. 2 is a perspective view of a light emitting element according to a first embodiment of the present invention.
Figure 3:
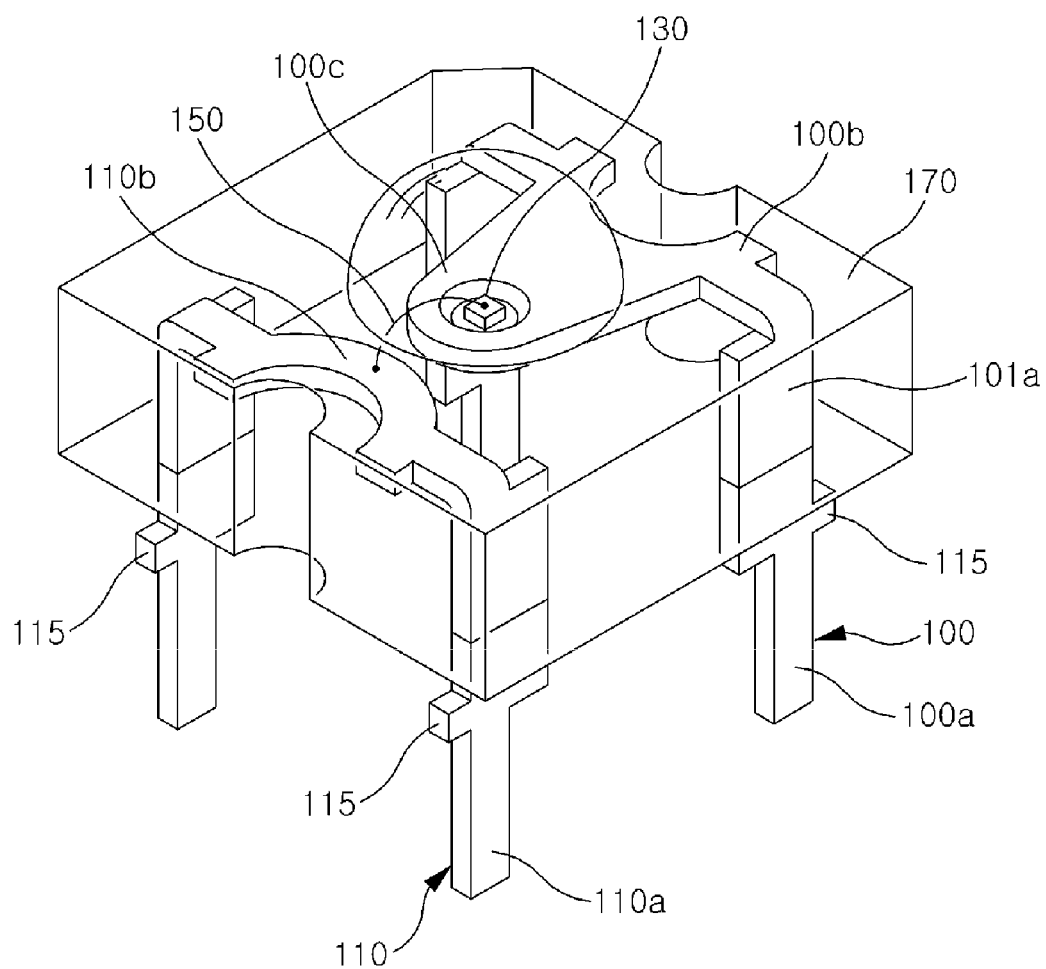
FIG. 3 is a perspective view of a light emitting element according to a modification of the first embodiment of the present invention.
Figure 4:
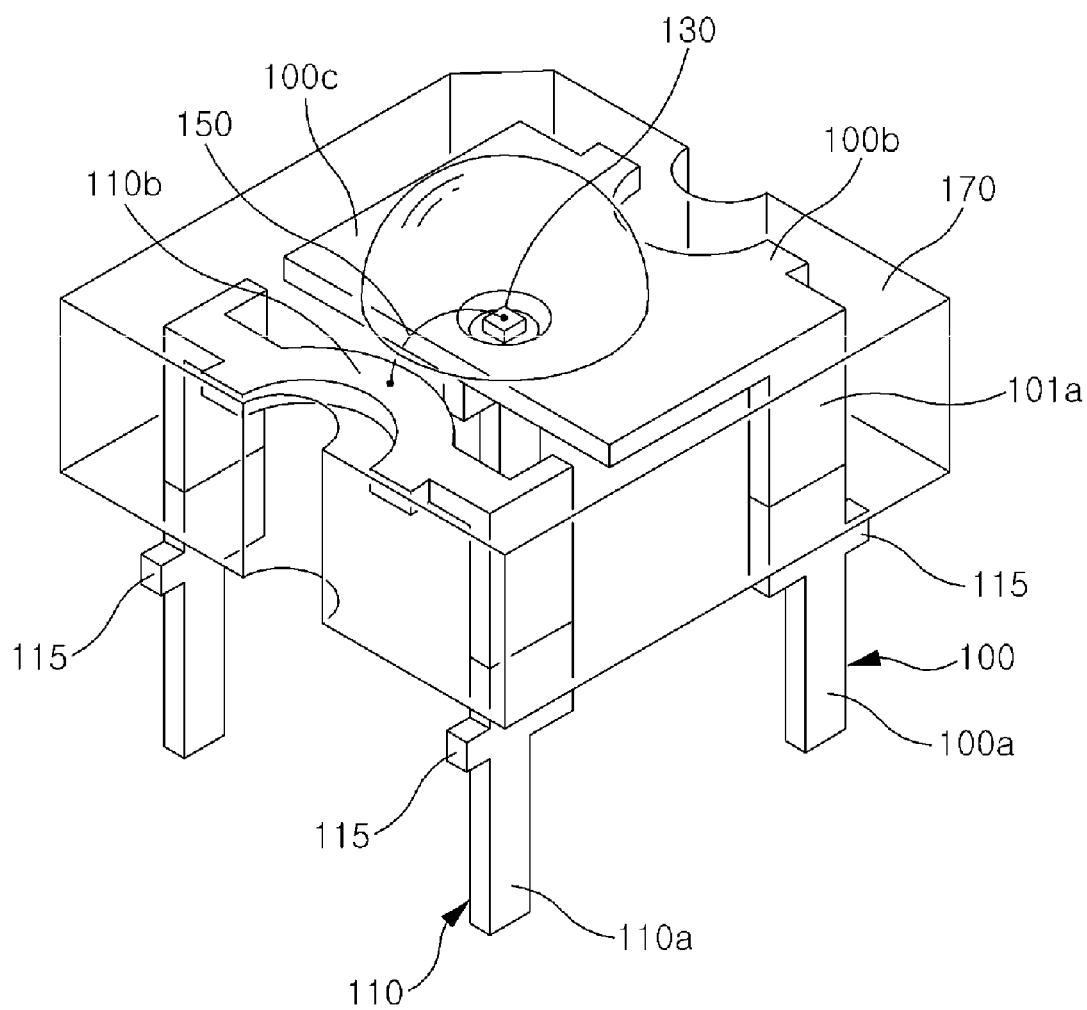
FIG. 4 is a perspective view of a light emitting element according to another modification of the first embodiment of the present invention.

FIG. 2 is a perspective view of a light emitting element according to a first embodiment of the present invention, FIG. 3 is a perspective view of a light emitting element according to a modification of the first embodiment of the present invention, and FIG. 4 is a perspective view of a light emitting element according to another modification of the first embodiment of the present invention.

As shown in FIG. 2, the light emitting element according to the first embodiment of the present invention includes first and second leads 100 and 110 having two pairs of leg sections 100a and 110a connected by connecting sections 100b and 110b, respectively; a chip seating section 100c formed to extend from the first connecting section 100b of the first lead 100 toward the second connecting section 110b of the second lead 110; a light emitting chip 130 mounted on the chip seating section 100c; a wire 150 connecting the light emitting chip 130 and the second lead 110; and a molding portion 170 encapsulating portions of the first and second leads 100 and 110, the light emitting chip 130 and the wire 150. At this time, each of the first and second leads 100 and 110 has two leg sections 100a or 110a, and each pair of the leg sections 100a and 110a are connected by the connecting section 100b or 110b at top portions of the leg sections.

Each of the first and second leads 100 and 110 is manufactured through a predetermined molding process, and comprises a pair of leg sections 100a and 110a and stoppers 115 formed at central portions of the leg sections 100a and 110a. The stoppers 115 are formed to protrude at the central portions of the leg sections 100a and 110a so that when the light emitting element is mounted on an element mounting member such as a substrate, only predetermined portions of the leg sections 100a and 110a are inserted into and supported on the element mounting member.

At this time, each of the leg sections 100a and 110a may have an upper leg portion 101a wider than a portion beneath the stopper 115 as shown in FIGS. 3 and 4. That is, the portion inserted into a slot of an element mounting member such as a standardized or ready-made substrate may be formed to have the same dimension as the prior art, while the portion exposed above the element mounting member can be wider. In this case, since the width of the upper leg portion 101a above the stopper 115 is larger than the size of a hole of the element mounting member through which a light emitting element will be mounted, the stopper 115 need not be formed.

Figure 9:
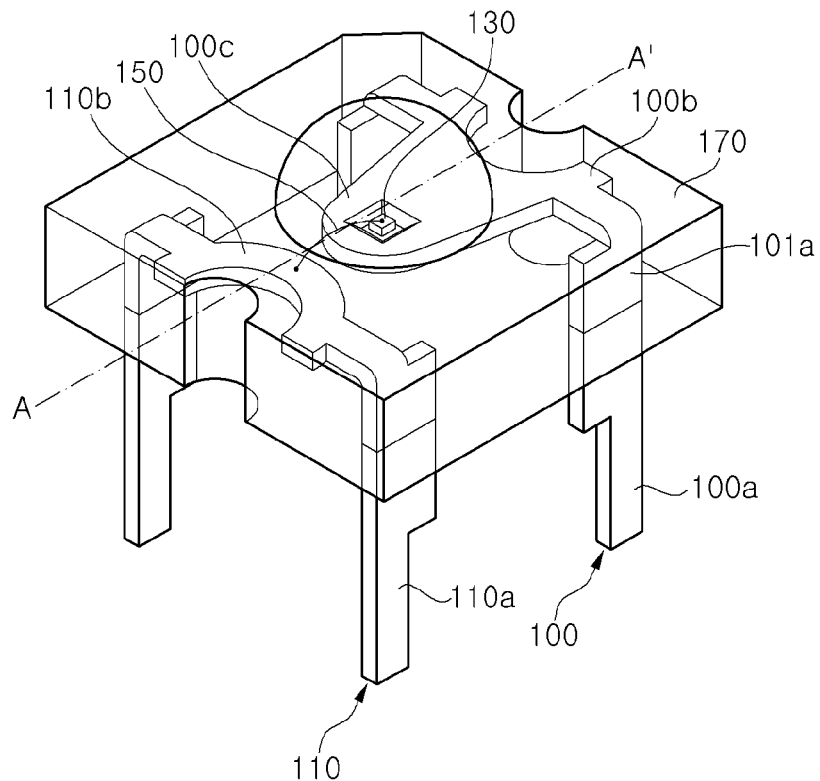
FIG. 9 is a perspective view of a light emitting element according to a fifth embodiment of the present invention.
Figure 11:
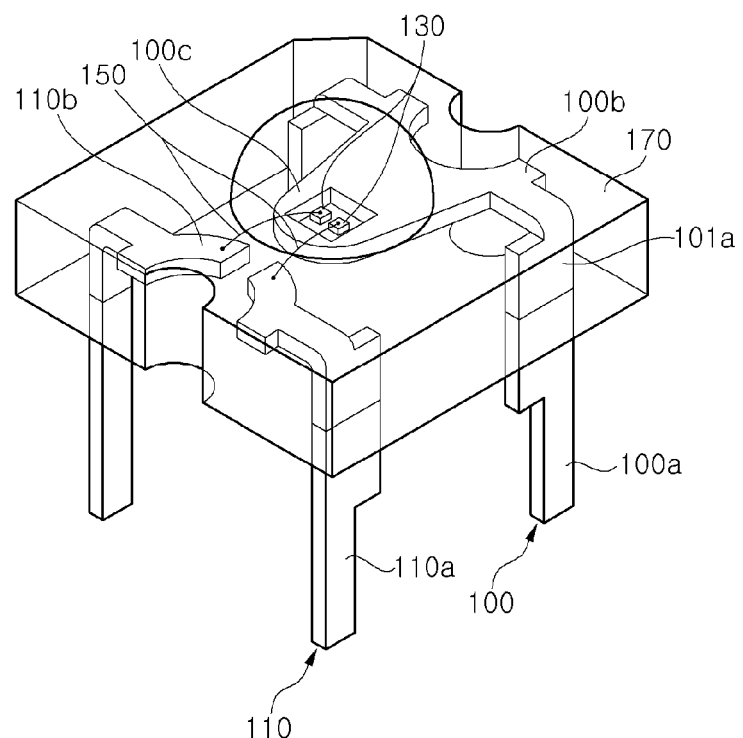
FIG. 11 is a perspective view of a light emitting element according to a sixth embodiment of the present invention.
Figure 12:
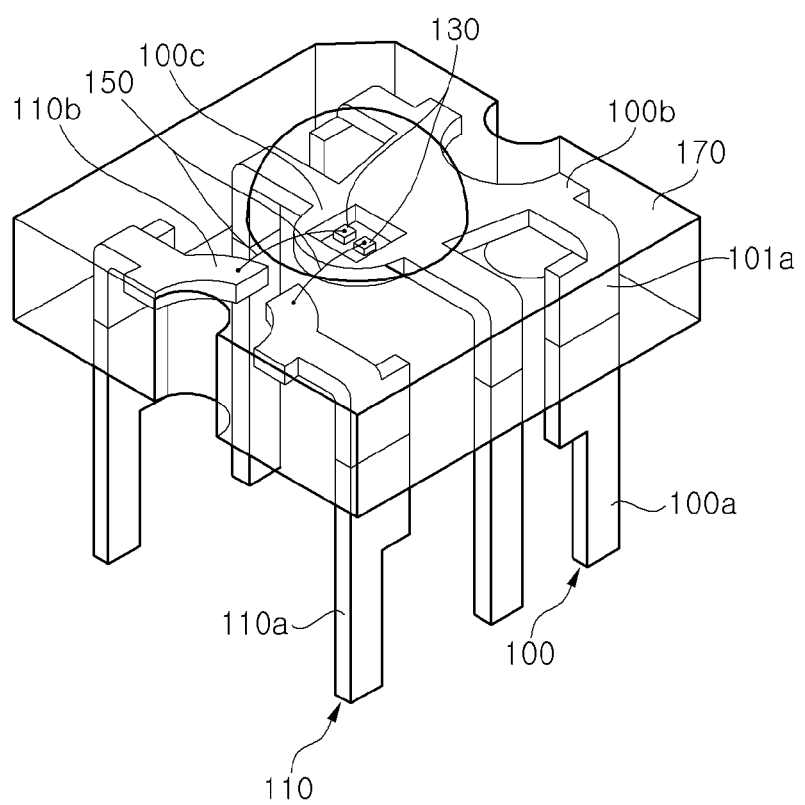
FIG. 12 is a perspective view of a light emitting element according to a seventh embodiment of the present invention.
Figure 13:
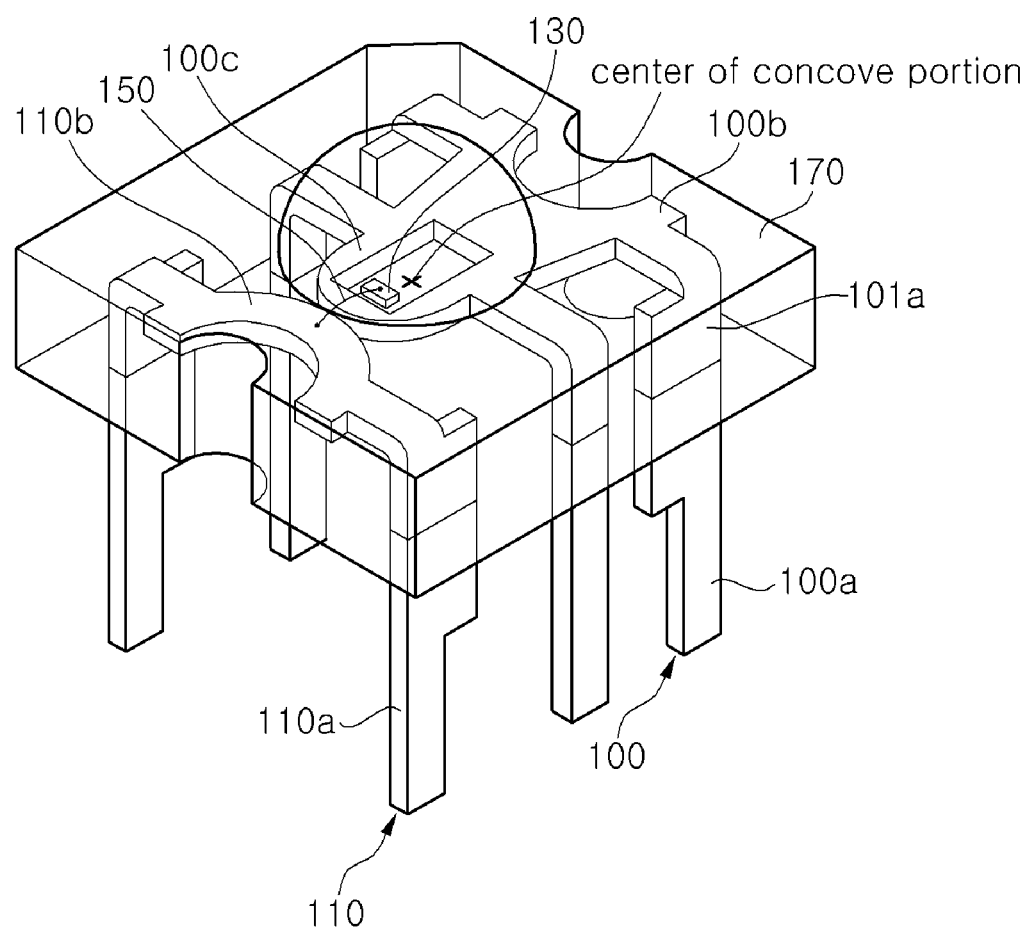
FIG. 13 is a perspective view of a light emitting element according to a eighth embodiment of the present invention.

The light emitting chip 130 is a vertical type light emitting chip and is mounted on a concave portion of the chip seating section 100c. At this time, the light emitting chip 130 may be a horizontal type light emitting chip of which first and second electrodes formed on the surfaces facing the same direction. In this case, an insulation layer may be formed between the horizontal type light emitting chip and the chip seating section 100c. Although the concave portion of the chip seating section 100c is shown as being circular, the concave portion may alternatively be formed to be substantially square, as shown in FIGS. 9, 11, and 12, so that the edges of the concave portion correspond to edges of the light emitting chip 130. The light emitting chip 130 and the concave portion of the chip seating section 100c may also be formed to each be a substantially rectangular shape, as shown in FIG. 13.

The wire 150 is used to connect the second electrode of the light emitting chip 130 and the second lead 110, and is generally formed of Au or Al. At this time, if the light emitting chip 130 is a horizontal type, the light emitting element may further include an additional metal wire for connecting the first electrode and the first lead 100.

Figure 10:
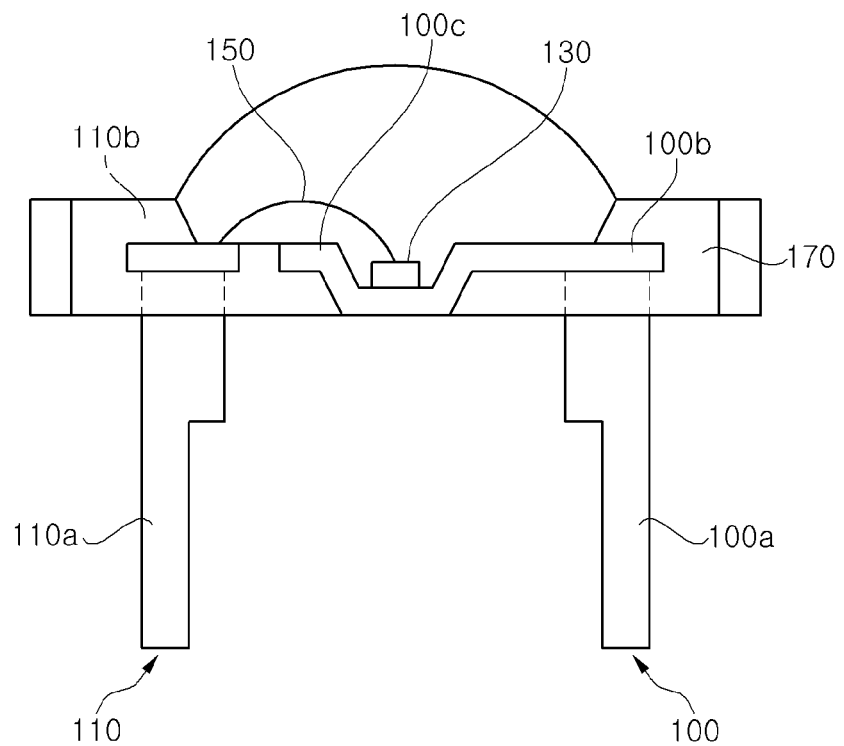
FIG. 10 is a sectional view of a light emitting element according to the fifth embodiment of the present invention, taken along line A-A' of the light emitting element shown in FIG. 9.

The molding portion 170, which protects the light emitting chip 130 and wire 150, and fixes the first and second leads 100 and 110 to be spaced apart from each other at a predetermined interval, is formed of epoxy or silicone resin using a mold such as an additional mold cup. Further, a convex lens may be formed on a top of the molding portion 170. As shown in the figures, a light-gathering effect can be obtained by forming the convex lens on the top of the molding portion 170. The present invention is not limited thereto, it will be readily understood by those skilled in the art that various modifications and changes can be made thereto. For example, as shown in FIG. 10, the molding portion 170 may be formed to encapsulate a first portion of the chip seating section 100c, and not encapsulate a second portion of the chip seating section 100c. Although FIG. 10 is a sectional view of the light emitting element shown in FIG. 9, the structure of the molding portion 170 in relation to the chip seating section 100c may be applied to the other embodiments of the present invention. Further, as shown in FIG. 9, the concave portion of the chip seating section 100c is spaced apart from the two leg sections 110a, but is nevertheless positioned relatively close to the two leg sections 110a, so that at least a portion of the two leg sections 110a, the concave portion of the chip seating section 100c, and the wire 150 may be positioned directly under the convex lens of the molding portion 170.

Further, a predetermined phosphor for obtaining the light emission with a desired color may be further included over the light emitting chip 130. For example, an inner molding portion heated and cured for a predetermined time may be formed in the interior of the chip seating section 100c by applying epoxy resin containing a phosphor thereto, and an outer molding portion of transparent epoxy resin may be formed around leading ends of the leads 100 and 110 such that the transmittance of light emitted from the light emitting chip 130 can be enhanced.

The chip seating section 100c on which the light emitting chip is mounted, is connected to the leg sections 100a through the first connecting section 100b. The light emitting chip 130 is mounted on the chip seating section 100c, and is formed in the shape of a concave portion so as to reflect light emitted from the light emitting chip 130 upward. Heat generated from the light emitting chip 130 when operating the light emitting element is conducted to the first leg sections 100a through the chip seating section 100c and the first connecting section 100b, and the transmitted heat is radiated to the outside through distal ends of the leg sections 100a. At this time, electric energy moves from the first connecting section 100b, which is an electrical connecting section, to the chip seating section 100c. Further, the heat generated from the light emitting chip 130 also moves through the same path. Thus, in a case where the first connecting section 100b is narrow, a thermal load is concentrated thereat, thereby causing a problem such as exfoliation. Moreover, since the area of the path through which the heat flows is small, a large amount of heat does not escape, which results in a problem in a heat radiation effect. Accordingly, if the first connecting section 100b is widened compared with the chip seating section 100c as shown in FIG. 3, the heat conducted from the chip seating section 100c can be rapidly radiated to the outside without a bottle-neck phenomenon between the chip seating section 100c and the first connecting section 100b. Further, if the widths of the chip seating section 100c and the first connecting section 100b are increased together and thus the chip seating section 100c is in the shape of a rectangle as shown in FIG. 4, the heat can be conducted more rapidly compared with the first connecting section 100b having the width gradually increased. That is, the first connecting section 100b is designed in various shapes to have the minimum width identical with or larger than the width of the chip seating section 100c, so that the heat generated from the light emitting chip 130 can be rapidly radiated to the outside without the bottle-neck phenomenon between the chip seating section 100c and the first connecting section 100b.

The comparison of heat radiation effects depending on the widths of the first connecting section 100b and the chip seating section 100c will be described with reference to the following table.

The following Table 1 is to compare the temperature of the light emitting elements according to the prior art and the first embodiment of the present invention. The maximum temperature is measured from the light emitting chip 130, the minimum temperature is measured from an outer surface of the light emitting element. The temperature difference is a difference value between the maximum and minimum temperatures. According to the following Table 1, in a case where the first connecting section 100b is wider than the chip seating section 100c, each of the maximum and minimum temperatures of the light emitting element according to the present invention is lower by about 1° C. than that of the prior art.

Further, in a case where the widths of the first connecting section 100b and the chip seating section 100c are increased together to be in the shape of a rectangle as shown in FIG. 4, it can be seen that each of the maximum and minimum temperatures of the light emitting element according to the present invention is lower by about 5° C. than that of the prior art, and the temperature differences of the present light emitting element are also lowered. Comparing values of the following Table 1, it can be understood that a heat radiation effect is superior when the widths of the first connecting section 100b and the chip seating section 100c are increased together to that when only the width of the first connecting section 100b is increased.

TABLE 1

|  | Max. Temp. [° C.] | Min. Temp. [° C.] | Temp. Diff. [° C.] |
| --- | --- | --- | --- |
| Prior art | 60.6 | 50.7 | 9.9 |
| Increased width of connecting section | 59.7 | 50.1 | 9.6 |
| Increased widths of connecting section and chip seating section | 55.3 | 46.8 | 8.5 |

Hereinafter, a process of manufacturing the light emitting element according to the first embodiment of the present invention will be briefly described.

Referring to FIG. 2, first, through a predetermined molding process, there are provided the first lead 100 having the pair of first leg sections 100a and the chip seating section 100c connected to the first leg sections 100a through the first connecting section 100b, and the second lead 110 having the pair of second leg sections 110a connected through the second connecting section 110b.

Thereafter, the light emitting chip 130 is mounted on the concave portion of the chip seating section 100c of the first lead 100. The light emitting chip 130 is a vertical type light emitting chip, and an adhesive agent (not shown) is interposed between the light emitting chip 130 and the chip seating section 100c. At this time, the light emitting chip 130 may be a horizontal type light emitting chip of which the first and second electrodes are formed on the surfaces facing the same direction. In this case, an insulation may be formed between the horizontal type light emitting chip and the chip seating section 100c.

Next, the wire 150 for connecting the light emitting chip 130 and the second lead 110 is formed through a wire bonding process.

Thereafter, the molding portion 170 encapsulating the light emitting chip 130 and the wire 150 is formed by injecting a certain amount of liquid epoxy or silicone resin into a prepared mold cup and then dipping the lead with the light emitting chip 130 mounted thereon within the mold cup for a predetermined time at a certain temperature.

After the molding portion 170 is cured, the mold cup is removed and unnecessary portions except the first and second leads 100 and 110 are trimmed, thereby completing the light emitting element according to the first embodiment of the present invention.

Next, a light emitting element according to a second embodiment of the present invention will be described with reference to the drawings. Descriptions overlapping with the aforementioned descriptions of the light emitting element according to the first embodiment of the present invention will be omitted or briefly described herein. At this time, all the descriptions of the first embodiment can be applied to the following embodiments, and the descriptions of the following embodiments can also be applied to the first embodiment.

Figure 5:
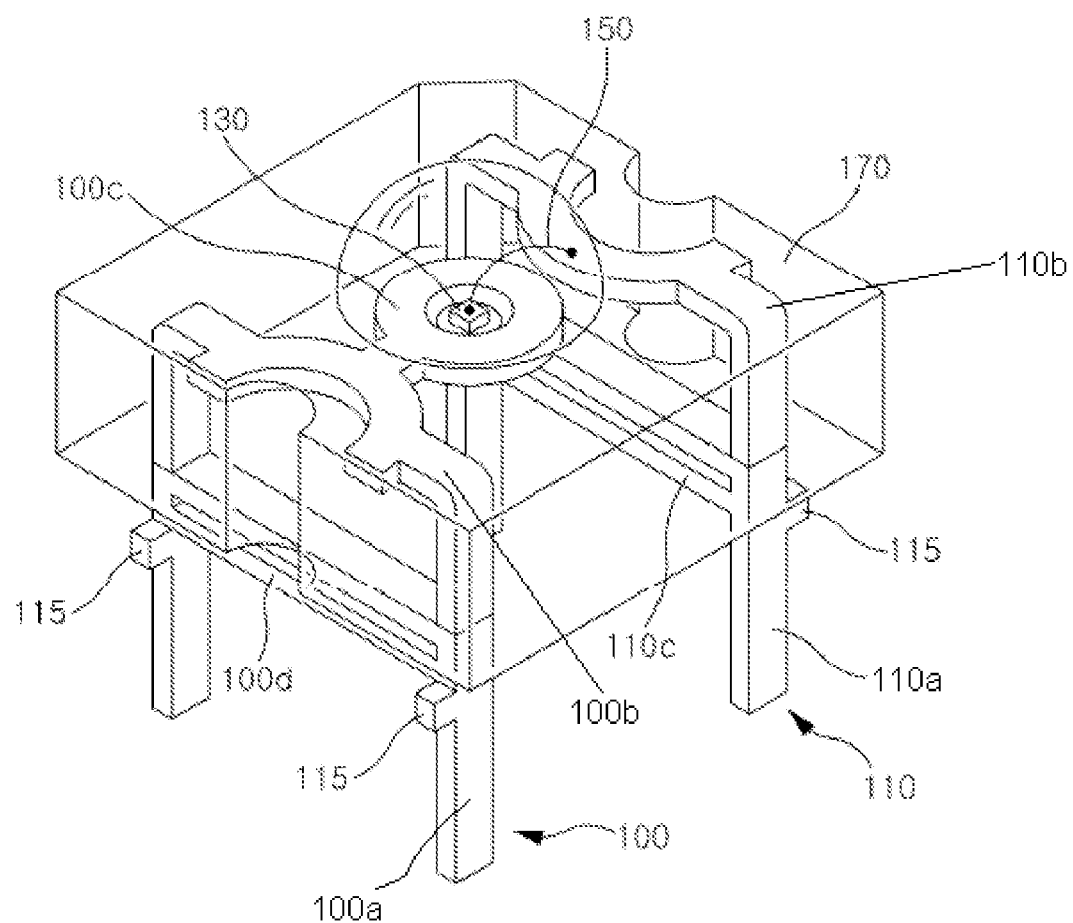
FIG. 5 is a perspective view of a light emitting element according to a second embodiment of the present invention.
Figure 6:
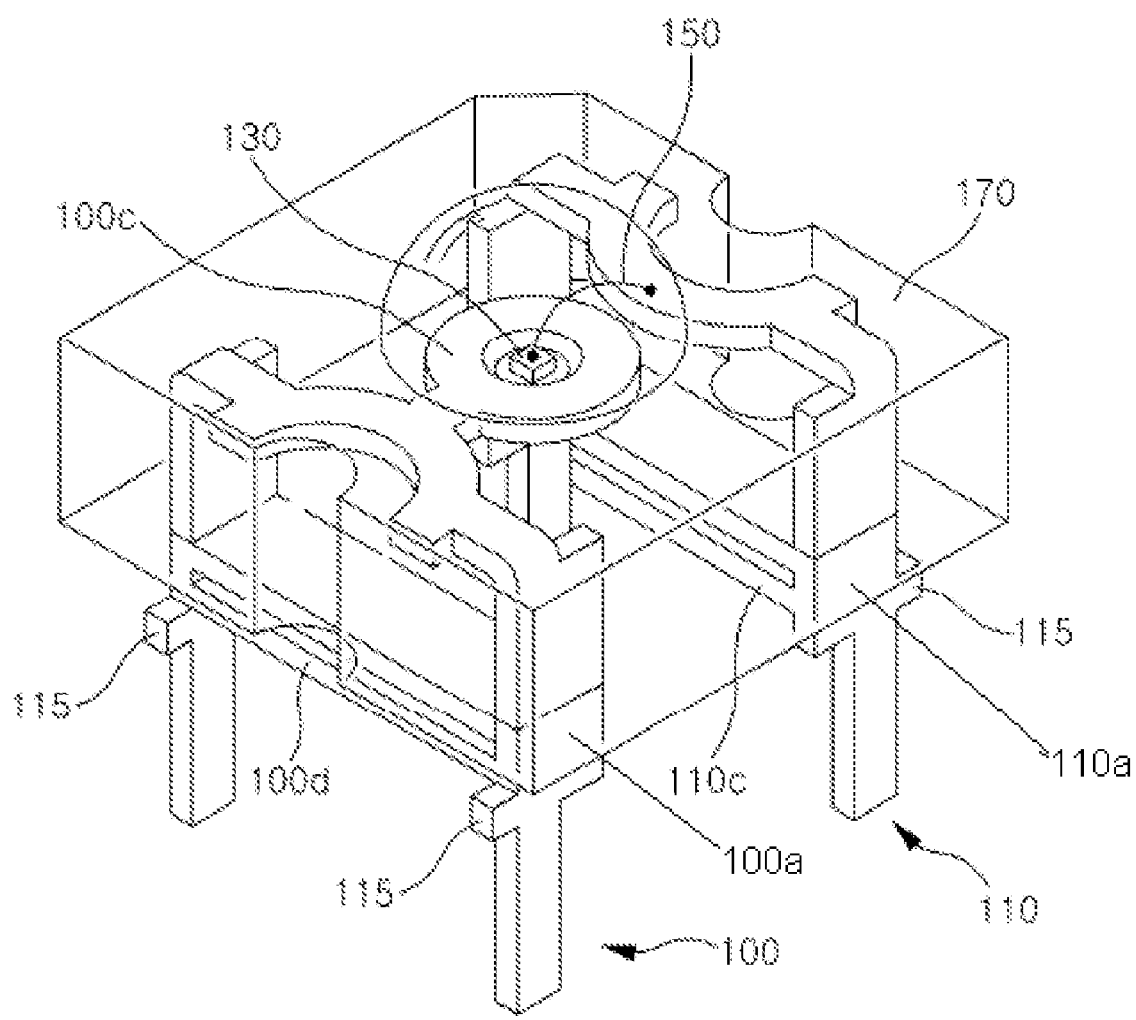
FIG. 6 is a perspective view of a light emitting element according to a modification of the second embodiment of the present invention.

FIG. 5 is a perspective view of a light emitting element according to a second embodiment of the present invention, and FIG. 6 is a perspective view of a light emitting element according to a modification of the second embodiment of the present invention.

As shown in FIG. 5, the light emitting element according to the second embodiment of the present invention includes first and second leads 100 and 110 having two pairs of leg sections 100a and 110a connected through first and second heat radiation fins 100d and 110c; a light emitting chip 130 mounted on the first lead 100; a wire 150 connecting the light emitting chip 130 and the second lead 110; and a molding portion 170 encapsulating portions of the first and second leads 100 and 110, the light emitting chip 130 and the wire 150. At this time, each of the first and second lead 100 and 110 has two leg sections 100a and 110a, and the leg sections are connected through a connecting section 100b at top portions thereof. Particularly, the first lead 100 further includes a chip seating section 100c formed to extend from the connecting section 100b toward a connecting section 110b of the second lead 110, and the light emitting chip 130 is mounted on the chip seating section 100c.

Each of the first and second leads 100 and 110 is manufactured through a predetermined molding process, and comprises a pair of leg sections 100a and 110a and stoppers 115 formed at central portions of the leg sections 100a and 110a. The light emitting chip 130 is mounted on the chip seating section 100c of the first lead 100, and the chip seating section 100c is formed in the shape of a concave portion to reflect light emitted from the light emitting chip 130 upward. When the light emitting element is mounted on an element mounting member such as a substrate, the stoppers 115 cause only predetermined portions of the leg sections 100a and 110a to be inserted into and supported on the element mounting member. The first and second heat radiation fins 100d and 110c are formed on regions between the stoppers 115 and the molding portion 170. The two leg sections 100a of the first lead 100 are connected to each other through the first heat radiation fin 100d, and the two leg sections 110a of the second lead 110 are also connected to each other through the second heat radiation fin 110c.

At this time, each of the leg sections 100a and 110a may have an upper leg portion wider than a portion beneath the stopper 115 as shown in FIG. 6. That is, the portion inserted into a slot of an element mounting member such as a standardized or ready-made substrate may be formed to have the same dimension as the prior art, while the portion exposed above the element mounting member can be wider. In this case, since the width of the upper leg portion above the stopper 115 is larger than the size of a hole of the element mounting member through which a light emitting element will be mounted, the stopper 115 need not be formed. As described above, since the first and second heat radiation fins 100d and 110c are formed between the leg sections 100a and 110a of the leads 100 and 110, the light emitting element according to this embodiment has a heat radiation area wider than the light emitting element according to the prior art. Thus, according to the present invention, there is an advantage in that a high-efficiency light emitting element can be manufactured.

The first and second heat radiation fins 100d and 110c, which are to rapidly radiate the heat generated from the light emitting chip 130 to the outside when operating the light emitting element, are made of the same material as the first and second leads 100 and 110. The first heat radiation fin 100d is formed such that the two leg sections of the first lead 100 are connected to each other. Further, the two leg sections 110a of the second lead 110 are also connected to each other through the second heat radiation fin 110c. However, the present invention is not limited thereto. That is, the leg sections of each of the first and second leads 100 and 110 may not be connected to each other by the heat radiation fin, and the heat radiation fin may be formed on only one of the leg sections 100a and 110a. Further, the shape of the first and second heat radiation fins 100d and 110c is not limited to a bar shown in FIGS. 5 and 6, but may be varied depending on the heat radiation performance and usage of the light emitting element. Preferably, the aforementioned first and second heat radiation fins 100d and 110c may be formed on the leg section between the stopper 115 and the molding portion 170 such that the heat radiation fins do not affect the mount of the light emitting element on the element mounting member such as a substrate. Further, since when two or more heat radiation fins are formed, a convection phenomenon occurs between the heat radiation fins, a high heat radiation effect can be expected as compared with when only one heat radiation fin is formed.

Meanwhile, if the surface of the element mounting member, to which the leg sections 100a and 110a of the light emitting element are mounted, is made of an insulation or a corresponding electrode pattern is formed, the stoppers 115 can be removed and the lowermost positioned first and second heat radiation fins 100d and 110c can serve as the stoppers 115.

The following Table 2 is to compare the temperature of the light emitting elements according to the prior art and the second embodiment of the present invention. The maximum temperature is measured from the light emitting chip 130, the minimum temperature is measured from an outer surface of the light emitting element. The temperature difference is a difference value between the maximum and minimum temperatures. According to the following Table 2, it can be seen that both maximum and minimum temperatures of the light emitting element of the present invention are lower by about 10° C. than those of the light emitting element according to the prior art, and the temperature difference between the maximum and minimum temperatures is also small in the present invention. Accordingly, since the light emitting element according to the present invention radiates internal heat more rapidly than the light emitting element according to the prior art, a high-efficiency light emitting element can be provided.

TABLE 2

|  | Max. Temp. [° C.] | Min. Temp. [° C.] | Temp. Diff. [° C.] |
| --- | --- | --- | --- |
| Prior art | 60.6 | 50.7 | 9.9 |
| Present Invention | 51.3 | 43.8 | 7.5 |

Hereinafter, a process of manufacturing the light emitting element according to the second embodiment of the present invention will be briefly described.

Referring to FIGS. 5 and 6, first, through a predetermined molding process, there are provided the first lead 100 having the pair of leg sections 100a and the stoppers 115 and first heat radiation fin 100d formed on the leg sections 100a, and the second lead 110 having the pair of leg sections 110a and the stoppers 115 and having the second heat radiation fin 110c formed on the leg sections 110a. At this time, the first and second heat radiation fins 100d and 100c can be formed after the first and second leads 100 and 110 are manufactured.

Thereafter, the light emitting chip 130 is mounted on the concave portion of the chip seating section 100c of the first lead 100. The light emitting chip 130 is a vertical type light emitting chip, and an adhesive agent (not shown) is interposed between the light emitting chip 130 and the chip seating section 100c. The wire 150 for connecting the light emitting chip 130 and the second lead 110 is formed through a wire bonding process.

Thereafter, the molding portion 170 encapsulating the light emitting chip 130 and the wire 150 is formed by injecting a certain amount of liquid epoxy or silicone resin into a prepared mold cup and then dipping the lead with the light emitting chip 130 mounted thereon within the mold cup for a predetermined time at a certain temperature.

After the molding portion 170 is cured, the mold cup is removed and unnecessary portions except the first and second heat radiation fins 100d and 110c and the first and second leads 100 and 110 are trimmed, thereby completing the light emitting element according to the second embodiment of the present invention.

Next, a light emitting element according to a third embodiment of the present invention will be described with reference to the drawings. Descriptions overlapping with the aforementioned embodiments will be omitted or briefly described herein.

Figure 7:
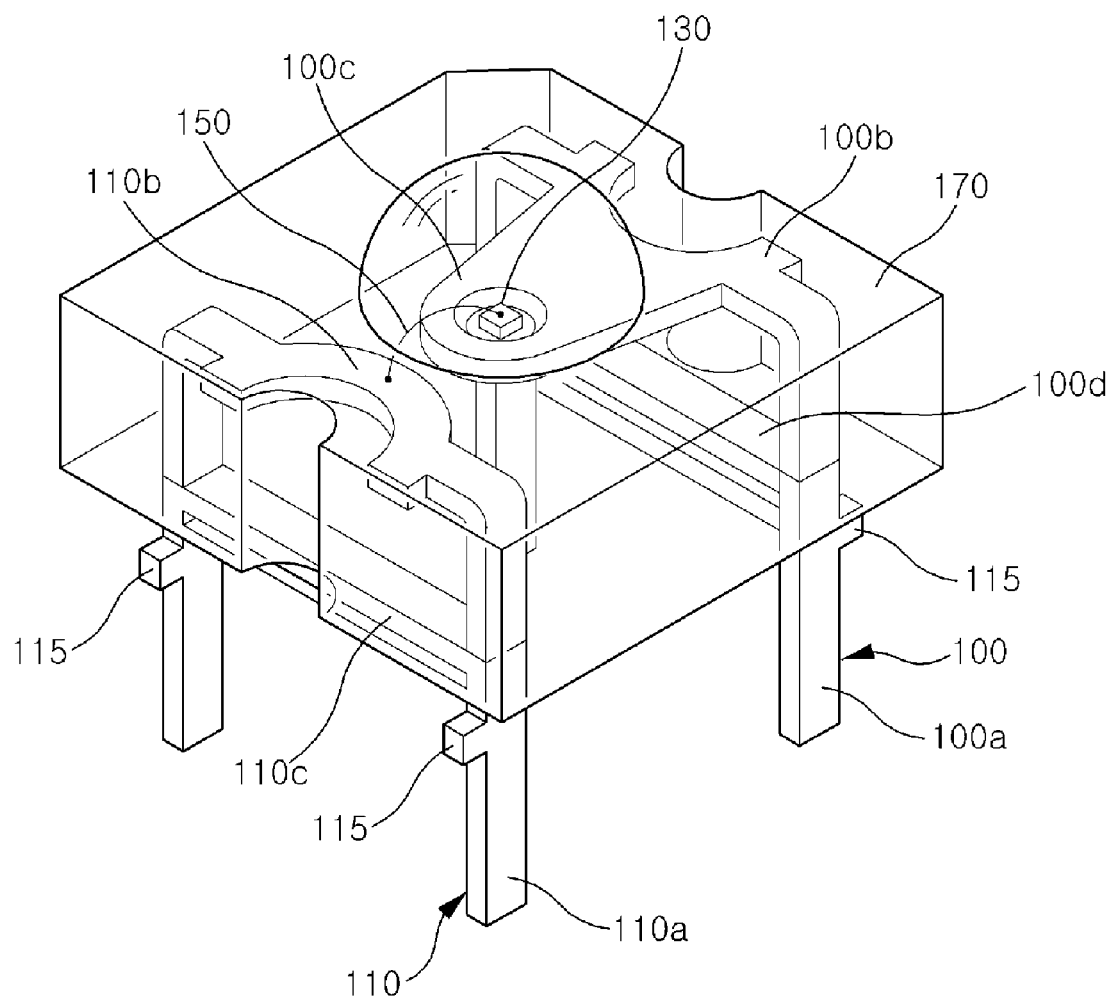
FIG. 7 is a perspective view of a light emitting element according to a third embodiment of the present invention.

FIG. 7 is a perspective view of a light emitting element according to a third embodiment of the present invention.

As shown in FIG. 7, the light emitting element according to the third embodiment of the present invention includes first and second leads 100 and 110 having two pairs of leg sections 100a and 110a connected by connecting sections 100b and 110b, respectively; a chip seating section 100c formed to extend from the first connecting section 100b of the first lead 100 toward the second connecting section 110b of the second lead 110; a light emitting chip 130 mounted on the chip seating section 100c; a wire 150 connecting the light emitting chip 130 and the second lead 110; and a molding portion 170 encapsulating portions of the first and second leads 100 and 110, the light emitting chip 130 and the wire 150. At this time, each of the first and second leads 100 and 110 has two leg sections 100a or 110a, and each pair of the leg sections 100a and 110a are connected by the connecting section 100b or 110b at top portions of the leg sections.

The chip seating section 100c on which the light emitting chip is mounted, is connected to the leg sections 100a through the first connecting section 100b. The light emitting chip 130 is mounted on the chip seating section 100c, and is formed in the shape of a concave portion so as to reflect light emitted from the light emitting chip 130 upward. Heat generated from the light emitting chip 130 when operating the light emitting element is conducted to the first leg sections 100a through the chip seating section 100c and the first connecting section, and the transmitted heat is radiated to the outside through distal ends of the leg sections 100a.

As described above, if the first connecting section 100b is widened compared with the chip seating section 100c, the heat conducted from the chip seating section 100c can be rapidly radiated to the outside without a bottle-neck phenomenon between the chip seating section 100c and the first connecting section 100b. That is, the first connecting section 100b is designed in various shapes to have the minimum width identical with or larger than the width of the chip seating section 100c, so that the heat generated from the light emitting chip 130 can be rapidly radiated to the outside without the bottle-neck phenomenon between the chip seating section 100c and the first connecting section 100b.

The first and second heat radiation fins 100d and 110c, which are to rapidly radiate the heat generated from the light emitting chip 130 to the outside when operating the light emitting element, are made of the same material as the first and second leads 100 and 110. The first heat radiation fin 100d is formed such that the two leg sections 100a of the first lead 100 are connected to each other. Further, the two leg sections 110a of the second lead 110 are also connected to each other through the second heat radiation fin 110c. However, the present invention is not limited thereto. That is, the leg sections 100a and 110a of each of the first and second leads 100 and 110 may not be connected to each other by the heat radiation fin 100d and 110c respectively, and the heat radiation fin may be formed on only one of the leg sections. Further, the shape of the first and second heat radiation fins 100d and 110c is not limited to a bar shown in FIGS. 5 and 6, but may be varied depending on the heat radiation performance and usage of the light emitting element. Preferably, the aforementioned first and second heat radiation fins 100d and 110c may be formed on the leg section between the stopper 115 and the molding portion 170 such that the heat radiation fins do not affect the mount of the light emitting element on the element mounting member such as a substrate. Further, since when two or more heat radiation fins are formed, a convection phenomenon occurs between the heat radiation fins, a high heat radiation effect can be expected as compared with when only one heat radiation fin is formed.

Meanwhile, in the light emitting elements according to this embodiment, a heat radiation effect can be more enhanced by making an upper portion of the leg section wider than a lower portion beneath the stopper 115 as in the previous embodiments.

As described above, the light emitting element according to this embodiment may have the combination of the aforementioned advantages of the first and second embodiments of the present invention, so that superior heat radiation performance can be expected.

Next, a light emitting element in which heat radiation fins are applied to a lamp type light emitting element, as a fourth embodiment of the present invention, will be described. Descriptions overlapping with the aforementioned embodiments will be omitted or briefly described herein.

Figure 8:
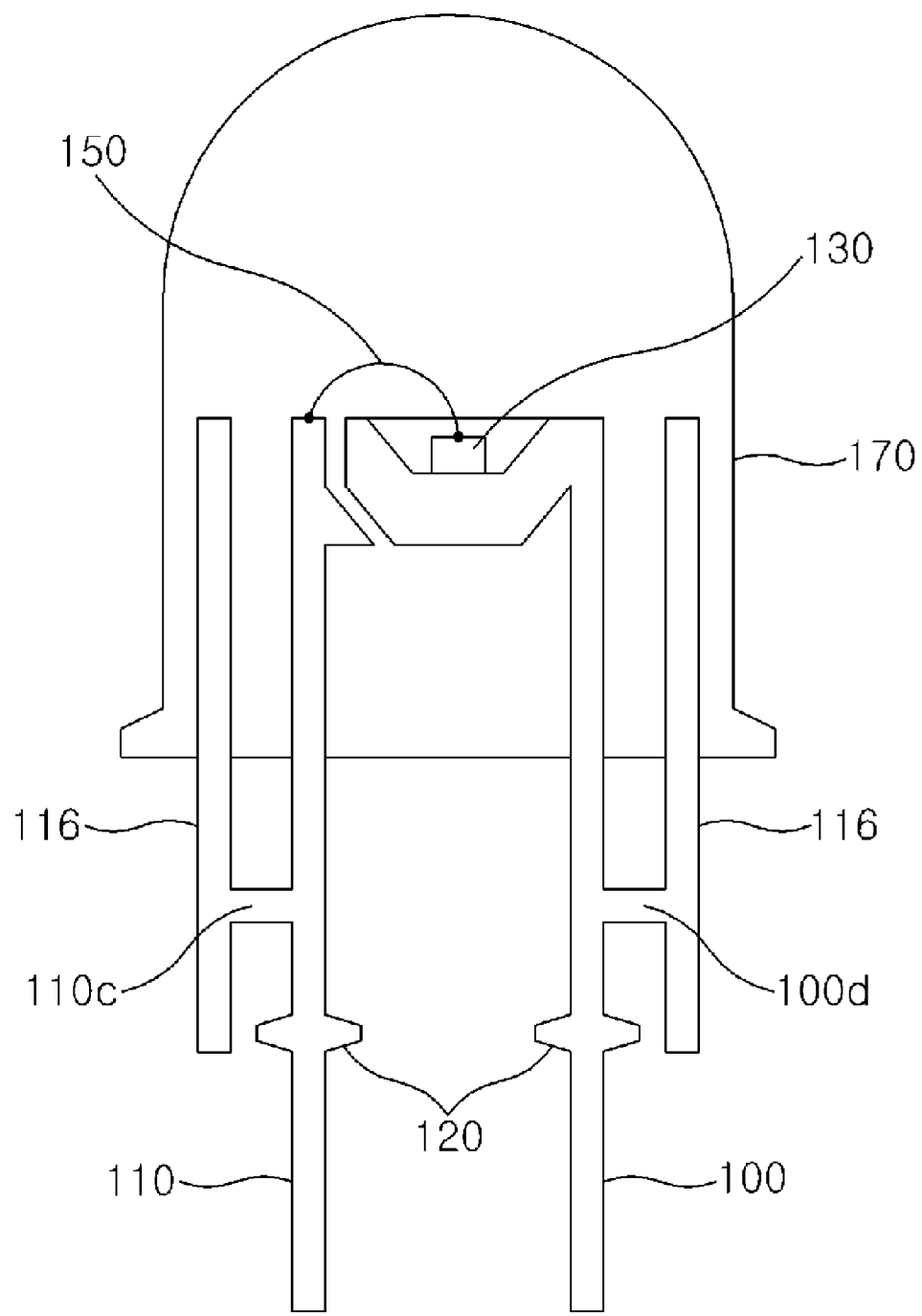
FIG. 8 is a sectional view of a light emitting element according to a fourth embodiment of the present invention.

FIG. 8 is a sectional view of a light emitting element according to a fourth embodiment of the present invention.

As shown in FIG. 8, the light emitting element according to the fourth embodiment of the present invention includes first and second leads 100 and 110 having dummy leads formed thereon; a light emitting chip 130 mounted on the first lead 100; a wire 150 connecting the light emitting chip 130 and the second lead 110; and a molding portion 170 encapsulating the light emitting chip and the wire 150.

The first and second leads 100 and 110 are formed of a metal such as Cu or Al through a predetermined pressing process. The first and second leads 100 and 110 are formed with the dummy leads 116. One of the dummy leads 116 and the first lead 100 are connected through a first heat radiation fin 100d, and the other of the dummy leads 116 and the second lead 110 are connected through a second heat radiation fin 110c. Further, it is preferred that at least a portion of each dummy lead 116 be encapsulated by the molding portion 170 such that the dummy leads 116 are stably supported and the heat radiation performance is enhanced. At this time, the dummy lead 116 may be formed at any one of the first and second leads 100 and 110, and the number and shape of the dummy leads may be changed depending on the performance and usage of the light emitting element. Each of the first and second leads 100 and 110 further includes a stopper 120, which allows a certain portion of the lead to be inserted into an element mounting member. However, the dummy lead 116 may be used as the stopper 120 by adjusting the position of the dummy lead 116. In this case, the stopper 120 need not be formed. Further, the dummy leads 116 also function as heat radiation fins, and radiate more heat to the outside as compared with when only the first and second heat radiation fins 100*d* and 110*c* are formed. Accordingly, there is an advantage in that it is easy to provide a high-efficiency light emitting element.

As shown in FIG. 11, more than one light emitting chip 130 may be disposed in the chip seating section 100*c*. In the present exemplary embodiment, each light emitting chip 130 is electrically connected to separate leg sections 110*a* and 110*b* via wires 150. FIG. 12 shows a light emitting element similar to the one shown in FIG. 11, except that there are additional leg sections extending from the connecting section 100*b*. FIG. 13 shows a light emitting element having a light emitting chip 130 electrically connected to leg section 110*b* via a wire 150. The chip seating section 100*c* is offset from the center of the molding portion 170. Additional leg sections extend from the connecting section 100*b*.

Although the present invention has been described with reference to the accompanying drawings and embodiments, it will be understood by those skilled in the art that various changes and modifications can be made thereto without departing from the technical spirit and scope of the present invention.

What is claimed is:

1. A light emitting element, comprising:
   a lead, comprising:
   a plurality of leg sections;
   a connecting section connecting a first leg section and a second leg section of the plurality of leg sections; and
   a chip seating section connected to the connecting section,
   wherein the first leg section comprises a first portion and a second portion, the second portion is connected to the connecting section, the first portion has a different shape from the second portion, and the second portion is wider than the connecting section where the second portion is connected to the connecting section.

2. The light emitting element of claim 1, wherein the first portion and the second portion have different widths from each other.

3. The light emitting element of claim 2, wherein the second portion has a greater width than the first portion.

4. The light emitting element of claim 1, wherein the first portion and the second portion have different areas from each other.

5. The light emitting element of claim 4, wherein the second portion has a greater area than the first portion.

6. The light emitting element of claim 1, wherein the first leg section comprises a heat radiation fin.

7. The light emitting element of claim 1, wherein the entire shape of the chip seating section and the connecting section is substantially square.

8. The light emitting element of claim 1, wherein the entire shape of the chip seating section and the connecting section becomes narrow from the connecting section to a distal end of the chip seating section.

9. The light emitting element of claim 1, further comprising a light emitting chip arranged on a portion of the chip seating section.

10. The light emitting element of claim 9, further comprising a molding portion covering at least the light emitting chip.

11. The light emitting element of claim 10, wherein the chip seating section comprises a concave portion, and the light emitting chip is arranged in a first region of the concave portion.

12. The light emitting element of claim 11, wherein the light emitting chip has a substantially square shape, and the concave portion has a substantially square shape so as to correspond to the light emitting chip.

13. The light emitting element of claim 11, wherein the light emitting chip comprises a substantially rectangular shape, and the concave portion comprises a substantially rectangular shape so as to correspond to the light emitting chip.

14. The light emitting element of claim 11, wherein the light emitting chip is arranged in the concave portion relatively close to another leg section separated from the first leg section and the second leg section.

15. The light emitting element of claim 10, wherein the light emitting chip is arranged at a central portion of the molding portion.

16. The light emitting element of claim 11, wherein the molding portion encapsulates the chip seating section, and a second region of the concave portion is exposed at the surface of the molding portion.

17. The light emitting element of claim 1, wherein the second portion is separated from the chip seating section by the connecting section.

18. The light emitting element of claim 1, wherein the first portion is separated from the connecting section by the second portion.

19. A light emitting element, comprising:
   a lead, comprising:
   a plurality of leg sections;
   a connecting section connecting at least two of the leg sections;
   a chip seating section connected to the connecting section;
   a molding portion encapsulating a portion of the lead, wherein the chip seating section comprises a concave portion; and
   a light emitting chip arranged on a first region of the concave portion,
   wherein a second region of the concave portion is exposed at the surface of the molding portion, and the leg sections are wider than the connecting section where the leg sections are connected to the connecting section.

20. The light emitting element of claim 19, wherein the light emitting chip has a substantially square shape, and the concave portion has a substantially square shape so as to correspond to the light emitting chip.

21. The light emitting element of claim 19, wherein at least one leg section of the leg sections comprises a first portion and a second portion, and the second portion is separated from the chip seating section by the connecting section.

22. The light emitting element of claim 19, wherein at least one leg section of the leg sections comprises a first portion and a second portion, and the first portion is separated from the connecting section by the second portion.

* * * * *